(12) United States Patent
Rapisarda

(10) Patent No.: US 9,039,442 B2
(45) Date of Patent: May 26, 2015

(54) SOLDER-LESS ELECTRICAL ASSEMBLY

(71) Applicant: Carmen Rapisarda, Apple Valley, CA (US)

(72) Inventor: Carmen Rapisarda, Apple Valley, CA (US)

(*) Notice: Subject to any disclaimer, the term of this patent is extended or adjusted under 35 U.S.C. 154(b) by 275 days.

(21) Appl. No.: 13/646,489

(22) Filed: Oct. 5, 2012

(65) Prior Publication Data

US 2013/0329407 A1 Dec. 12, 2013

Related U.S. Application Data

(63) Continuation-in-part of application No. 13/294,095, filed on Nov. 10, 2011, now Pat. No. 8,789,965, and a continuation-in-part of application No. 13/646,311, filed on Oct. 5, 2012, now Pat. No. 8,923,006, and a continuation-in-part of application No. 13/646,376, filed on Oct. 5, 2012, now Pat. No. 8,923,002, which is a continuation-in-part of application No. 13/646,393, filed on Oct. 5, 2012.

(51) Int. Cl.
*H01R 3/00* (2006.01)
*H01R 4/24* (2006.01)
*H01R 4/26* (2006.01)

(52) U.S. Cl.
CPC ............... *H01R 4/2404* (2013.01); *H01R 4/26* (2013.01)

(58) Field of Classification Search
USPC .................................................. 439/500, 76.1
See application file for complete search history.

(56) References Cited

U.S. PATENT DOCUMENTS

| 2,751,570 | A | 6/1956 | Broske |
| 3,988,707 | A | 10/1976 | Moser et al. |
| 4,140,360 | A | 2/1979 | Huber |
| 4,405,187 | A | 9/1983 | Muller et al. |
| 4,758,927 | A | 7/1988 | Berg |
| 5,881,453 | A | 3/1999 | Avery et al. |
| 5,947,580 | A | 9/1999 | Chien |
| 6,062,901 | A | 5/2000 | Liu et al. |
| 6,290,534 | B1* | 9/2001 | Sadler ........................ 439/534 |
| 6,733,319 | B1* | 5/2004 | Jørgensen ................... 439/329 |
| 6,991,488 | B2 | 1/2006 | Freakes |
| 7,147,337 | B1 | 12/2006 | Rapisarda |
| 7,238,032 | B2* | 7/2007 | Pabst et al. ................... 439/67 |
| 7,462,035 | B2* | 12/2008 | Lee et al. ..................... 439/37 |
| 7,556,543 | B2 | 7/2009 | Weber |
| 7,591,672 | B2 | 9/2009 | Wu |
| 8,004,856 | B2 | 8/2011 | Rapisarda |
| 8,434,927 | B2* | 5/2013 | Chien ........................ 362/641 |
| 2001/0037565 | A1 | 11/2001 | Prasad et al. |
| 2006/0107523 | A1 | 5/2006 | Blossfeld et al. |

OTHER PUBLICATIONS

TE Connectivity; CoolSplice Connectors for Lighting Applications Offer Easy Terminations, Options for Wire Confirgurations, Style and Space Savings; Apr. 12, 2011; TE Connectivity.

* cited by examiner

*Primary Examiner* — Hien Vu
(74) *Attorney, Agent, or Firm* — Roy L. Anderson; Wagner, Anderson & Bright

(57) ABSTRACT

A PCB assembly can be attached to hold one or more such assemblies. A resilient PCB housing holds a PCB by an interference fit while conductive wires are inserted into its wire cavity so that exposed portions of conductive wires make electrical contact with electrical traces of the PCB which is biased by wire insulation. Two conductors can be held by the PCB housing which are forced into electrical contact with the PCB when it is inserted into the resilient PCB housing which then biases such contacts. A switch can also be held by a switch interference fit with the resilient PCB housing such that its leads are biased against the PCB by the resilient PCB housing.

19 Claims, 10 Drawing Sheets

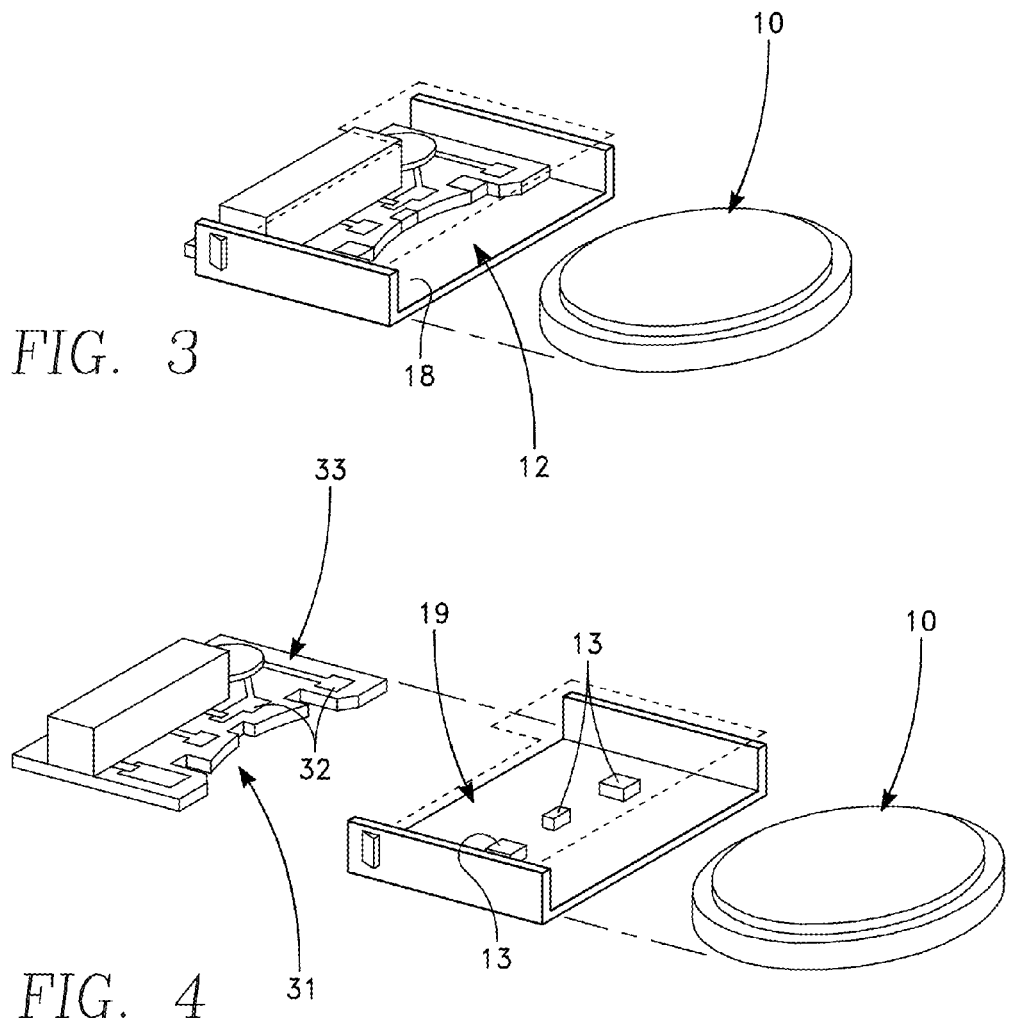
FIG. 3
FIG. 4
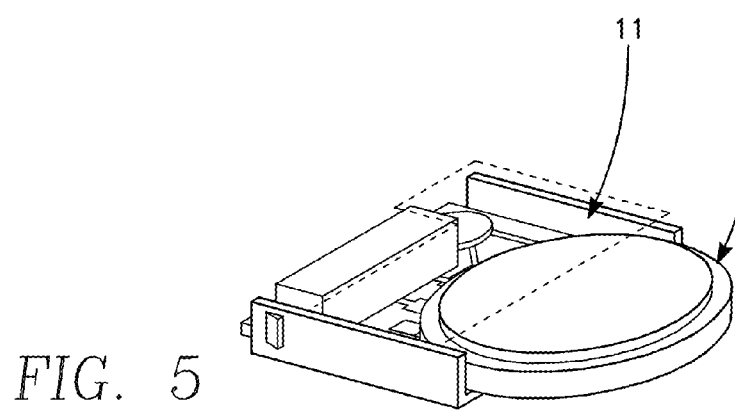
FIG. 5

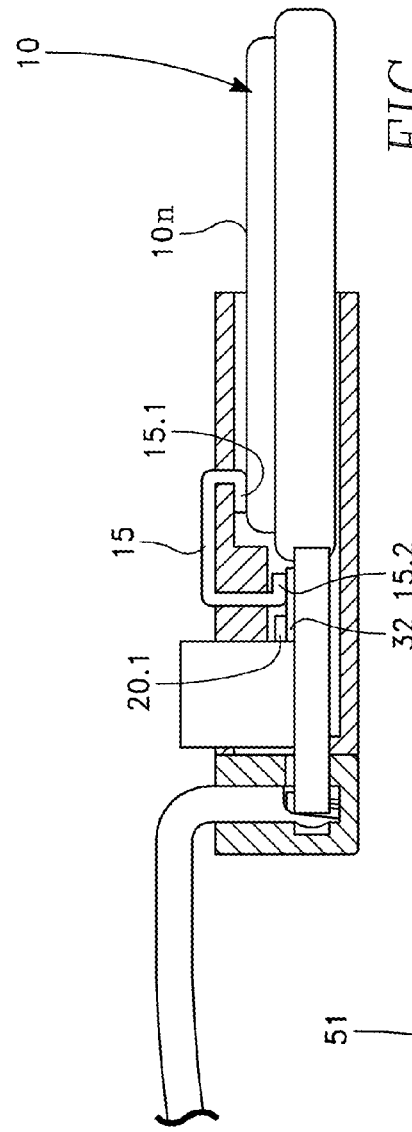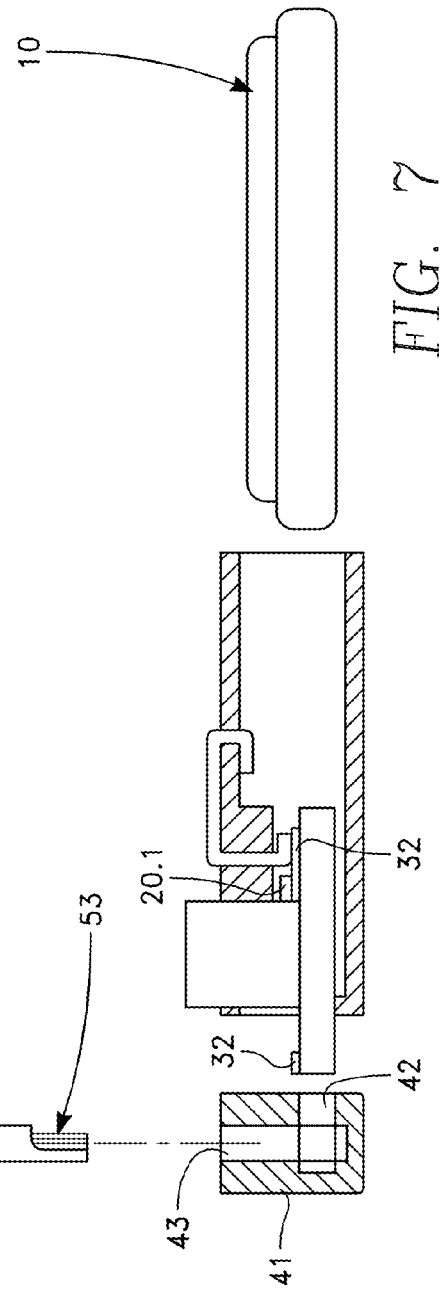

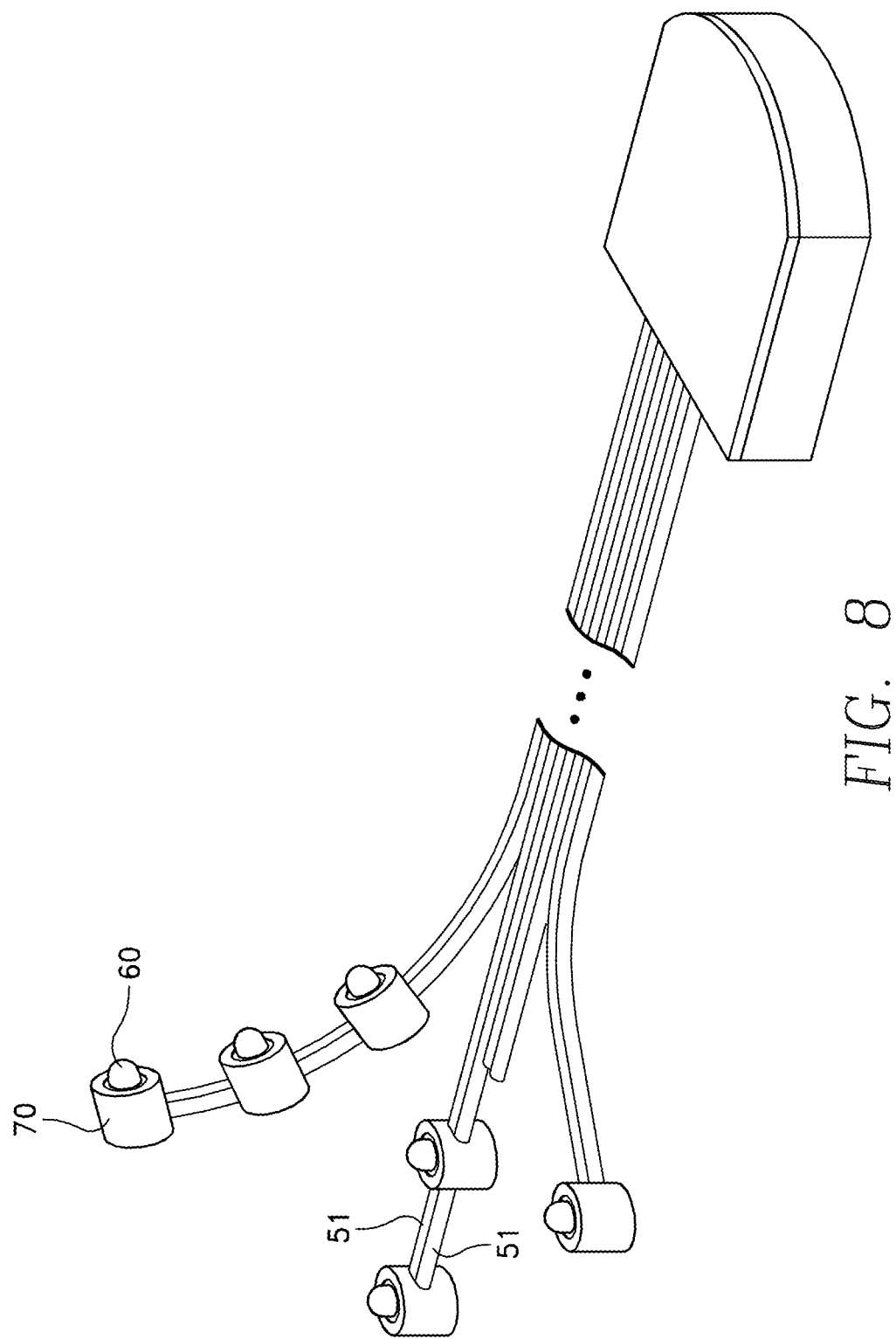

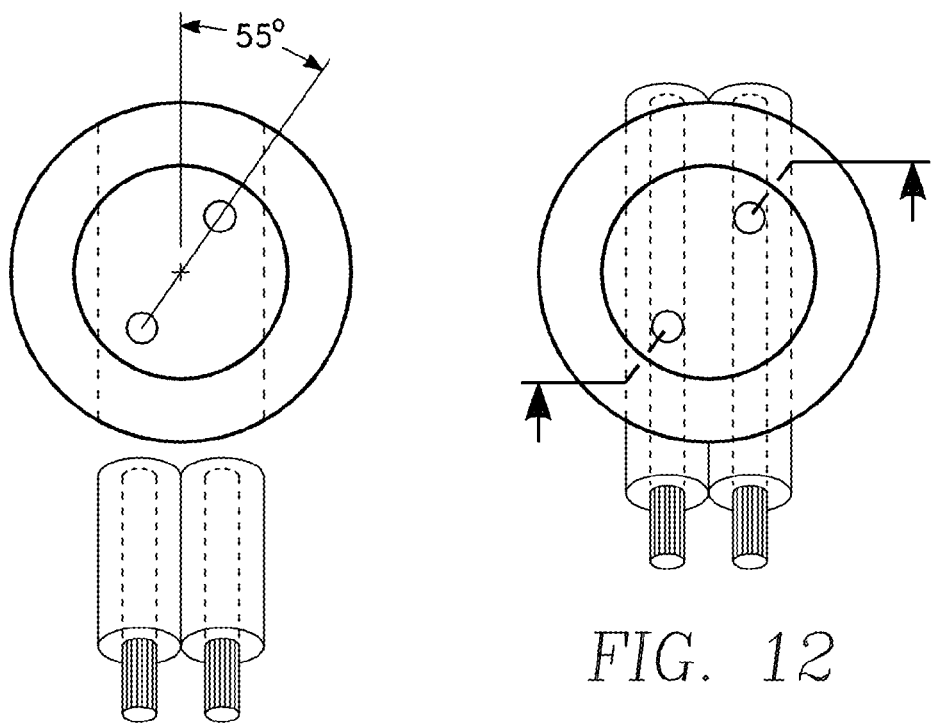
FIG. 11
FIG. 12
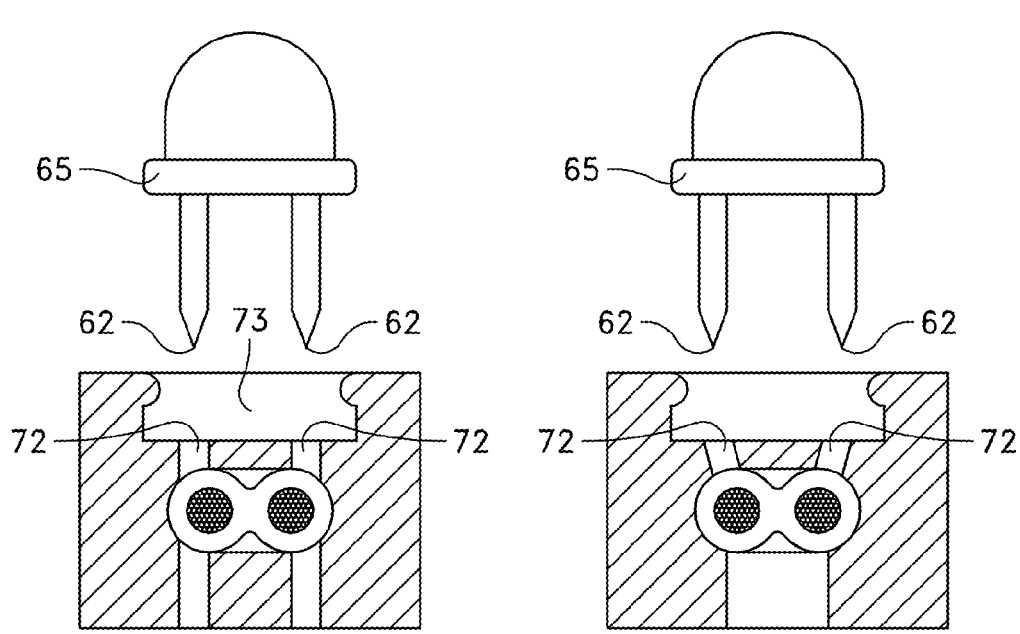
FIG. 13
FIG. 13A

SOLDER-LESS ELECTRICAL ASSEMBLY

CROSS REFERENCE TO RELATED APPLICATIONS

This application is a continuation-in-part of U.S. Ser. No. 13/294,095, filed Nov. 10, 2011, entitled Solder-Less Electrical Assembly and Process for its Manufacture, the disclosure of which is specifically incorporated herein by reference. This application is also a continuation-in-part U.S. Ser. Nos. 13/646,311, 13/646,376 and 13/646,393, all of which were filed Oct. 5, 2012, the disclosures of which are also incorporated herein by reference.

FIELD OF THE INVENTION

The present invention is in the field of solder-less electrical assemblies.

BACKGROUND OF THE INVENTION

Electrical assemblies have long used lead solder to help make and keep electrical connections. However, use of solder, and especially lead solder, has come under increasing criticism due to environmental concerns.

The present invention is especially well-suited for, but not limited to use in, footwear, wearing apparel and toys. For an electrical assembly to be useful in such fields it must be compact and inexpensive to manufacture. This means that both the number of parts, as well as the number of manufacturing steps, must be kept to the bare minimum if one is to be competitive in the world today.

The present invention advances simple, compact and easy to manufacture electrical assemblies that are well-suited for use in a variety of applications, including footwear, apparel and toys.

The present invention improves upon prior inventions of the same inventor, including U.S. Pat. Nos. 7,147,337 and 8,004,856.

SUMMARY OF THE INVENTION

The present invention is generally directed to a solder-less electrical assembly in which an electrical component with two conductive leads, as well as two conductive wires with a conductor and an insulator, are held within a housing. The conductive wires are inserted into and held by a wire cavity of the housing while each of the two conductive leads is inserted into a lead hole of the housing so that an electrical contact is made with a conductor of one of the conductive wires.

Each of the two conductive leads of the electrical component can have a sharp point which penetrates the insulator when the electrical component is inserted into the housing to create an interference fit between the electrical component and the housing, and the two lead holes can be two channels that guide the two conductive leads into alignment with the conductor to create an electrical contact in which the conductor is compressed against the housing to help secure the electrical contact.

The assembly can include multiple additional electrical components (which may or may not be LEDs) held in similar housings attached their own pairs of wires. When LEDs are to be included in the assembly, multiple LEDs can be included on a single pair of conductive wires, and multiple wires with multiple strings of LEDs that will light in parallel can be included in the assembly, so that more than 6 LEDs and four or more strings of multiple LEDs can be energized by a single battery included within the assembly.

A PCB assembly can be attached to one or more pairs of conductive wires that hold one or more electrical assemblies. A PCB is held in a resilient PCB housing by an interference fit without the use of any solder. The one or more pairs of conductive wires are inserted into a wire cavity of the PCB housing so that exposed portions of the conductor of the conductive wires makes electrical contact with an electrical trace of the PCB and insulation of the wires biases the exposed portions of the conductors into electrical contact with the traces.

A pair of conductors can be held by the PCB housing such that insertion of the PCB into a PCB cavity to form the PCB interference fit forces the conductors into electrical contact with the PCB while the resilient PCB housing biases such contacts and each of the conductors can each be held within a unique channel of the resilient PCB housing which is independently resilient. A battery can be inserted into the PCB housing where it is held by a battery interference fit without the use of any solder and insertion of such battery can cause each of the conductors (which can have a u shape before assembly and then have one or more leads bend over during assembly) make mechanical and electrical contact with the battery to complete an electrical powered circuit. A switch can also be held by a switch interference fit with the resilient PCB housing such that its leads are biased against the PCB by the resilient PCB housing.

Accordingly, it is a primary object of the present invention to provide an improved solder-less electrical assembly.

This and further objects and advantages will be apparent to those skilled in the art in connection with the drawings and the detailed description of the invention set forth below.

BRIEF DESCRIPTION OF THE DRAWINGS

FIG. 1 is an exploded assembly drawing illustrating one electrical assembly according to the present invention while

FIG. 3 illustrates a battery block of the electrical assembly of FIG. 1 showing the block with its battery removed, looking into a side view from the direction in which a battery would be inserted, FIG. 4 is a partially exploded view of FIG. 3, and FIG. 5 is an assembled view of FIG. 3.

FIG. 6 is a side view of the electrical assembly of FIG. 1 while

FIG. 7 is a partially exploded view of FIG. 6.

FIG. 8 illustrates the electrical assembly shown in FIG. 1 in a closed state, with multiple LEDs held in multiple wires of a ribbon wire.

FIG. 9 illustrates an LED block which holds an LED at an end of a wire pair while

FIG. 11 is a top view of an LED block illustrating how the LED leads are aligned to connect with the wire while FIG. 12 illustrates the wire pair inserted into the LED block and how the LED leads will align with conductive members of the wire pair.

FIG. 13 is a side view of an LED block showing an LED to be inserted while

FIG. 14 illustrates its insertion.

FIG. 13a shows an alternative embodiment to FIG. 13 in which the LED lead cavities are angled to facilitate alignment.

FIG. 15 illustrates how an LED block can channel and align LED leads to make contact with conductive members of a wire pair while FIG. 16 illustrates insertion of an LED into an end of a wire pair.

FIG. 18 is an exploded view of the interconnector while

DETAILED DESCRIPTION OF THE INVENTION

The present invention details how various parts can easily be assembled without the use of solder. Although not limited to a final assembly, the present invention is especially well suited to assembly of a package useful for controlling lighting of multiple light emitting diodes ("LEDs") through movement, which itself is useful in a variety of products, such as, for example, footwear, clothing and toys. It bears note, however, that techniques and assemblies described herein in connection with such usage can be applied to many additional fields.

In the Figures and the following description, number designations indicate various features of the invention, with like number designations referring to like features throughout both the drawings and the description. Although the Figures are described in greater detail below, the following is a glossary of the elements identified in the Figures.

Figure 1:
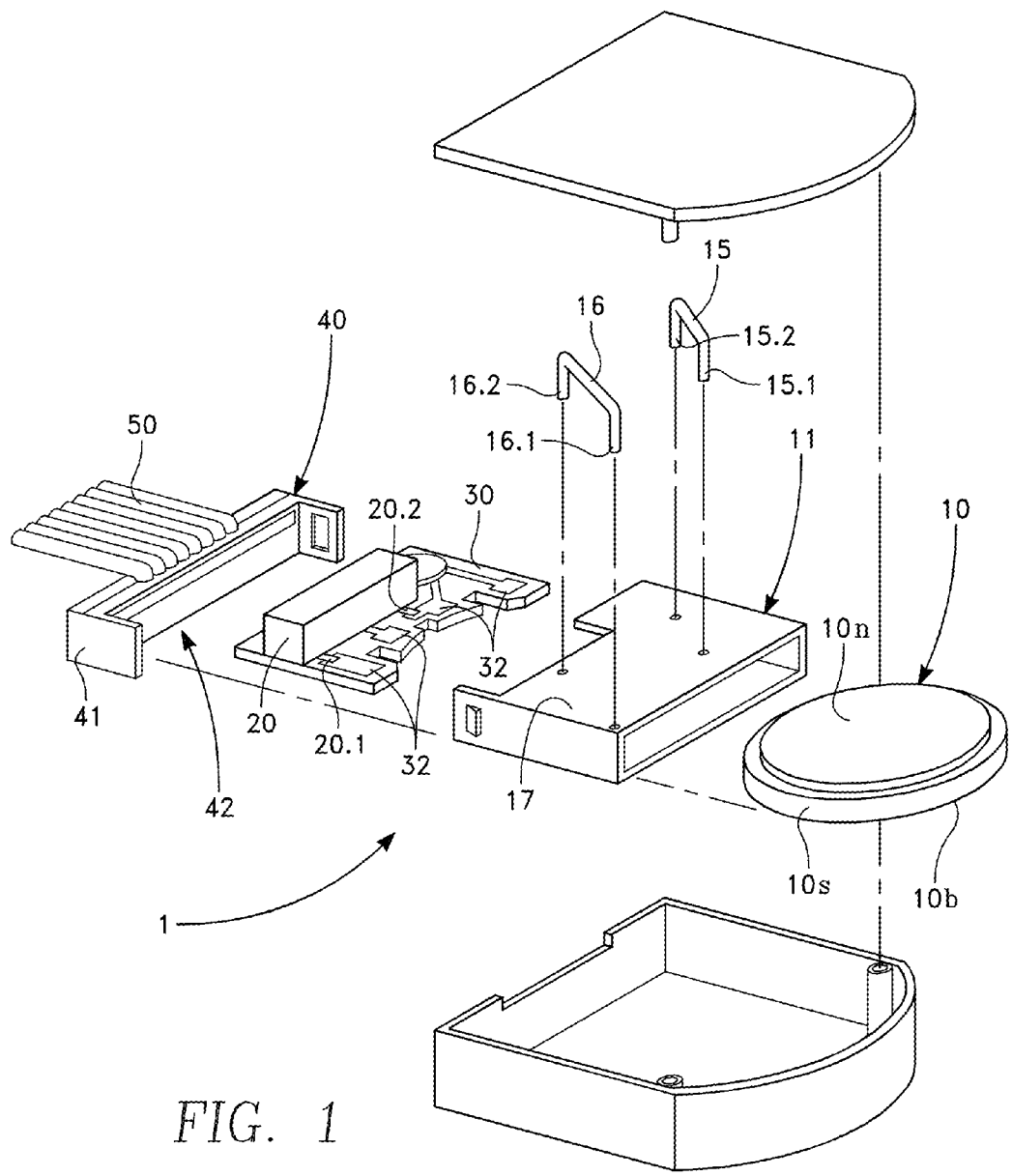

GLOSSARY 1 electrical assembly
10 battery
10b bottom surface of battery 10
10n negative surface of battery 10
10s side surface of battery 10
11 battery block
12 battery opening (in battery block 11)
13 column
15 conductor
15.1 first lead of conductor 15
15.2 second lead of conductor 15
16 conductor
16.1 first lead of conductor 16
16.2 second lead of conductor 16
17 top surface
18 bottom surface
19 PCB opening (in battery block 11)
20 switch assembly
20.1 first switch assembly lead
20.2 second switch assembly lead
30 printed circuit board ("PCB")
31 radius (in PCB 30)
32 conductive traces and pads
33 electronics
40 ribbon block assembly
41 ribbon block
42 PCB opening (in ribbon block 41)
43 ribbon opening (in ribbon block 41)
50 ribbon wire assembly
51 conductive wire
52 insulative covering (surrounding a conductive wire 51)
53 stripped portion of insulative covering 52
60 light emitting diode ("LED")
61.1 first LED lead
61.2 second LED lead
62 sharp pin point
65 LED base
70 LED block
71 wire hole
72 LED lead cavity
73 cavity (in which LED 60 is seated)
74 stress reliever
100 outer case
101 case cover
102 case bottom
103 male member
104 female member FIG. 1 illustrates an assembly, shown generally as 1, that has multiple subcomponents that are assembled together—one or more batteries 10, a battery block 11, a switch assembly 20, a PCB 30, a ribbon block assembly 40, and two conductors, 15 and 16. The ribbon block assembly 40 may have its own subassemblies attached to its other end, and/or support multiple LEDs in parallel, as will be discussed below.

Battery 10, in an especially preferred embodiment, is a lithium 3 volt button cell battery. This type of battery allows positive electrical contact to be made with its upper negative surface 10n and positive electrical contact to be made with either its side surfaces 10s or its bottom surface 10b. In an alternative embodiment, more than one battery can be stacked on top of each other.

Battery block 11, shown in FIGS. 3-5, in an especially preferred embodiment, is molded from resilient material, such as plastic. Two conductors, 15 and 16, are attached to battery block 11 in either one or two assembly steps. Conductors 15 and 16 can be forced through a wall of battery block 11 or preformed holes or pilot holes (not shown) can be used to assist in this assembly step. Conductors 15 and 16, which might be thought of as resembling u-shaped staples, are made of electrically conductive materials and each has two leads that extend down into an interior cavity of battery block where they will make electrical contact as is described later. In one embodiment of the invention, conductors 15 and 16 are staples that are assembled by a stapling step.

After conductors 15 and 16 have been assembled to battery block 11, battery 10 is inserted into battery opening 12 formed in battery block 11 where it will be held in place by an interference fit. During insertion of battery 10 into battery opening 12, first lead 15.1 of conductor 15 will come into contact with negative surface ion of battery 10 and be bent over due to the insertion process (see FIG. 6) to secure electrical contact with the battery. Bending first lead 15.1, in an especially preferred embodiment, also assists with creating a more secure interference fit to hold battery 10 in place due to resiliency of the battery block material which forces now bent first lead 15.1 against battery 10. During the same insertion step first lead 16.1 of conductor 16 will make positive electrical contact with battery 10 and, in an especially preferred embodiment, the electrical contact will be made with a side surface 10s of battery 10. Making electrical contact with side surface 10s is especially preferred because it allows both conductors 15 and 16 to be assembled to the same surface of battery block 11, although conductor 16 could alternatively be assembled to a bottom surface and make electrical contact with bottom surface 10b of battery 10 in the same manner as was done with electrical conductor 15 and negative surface 10n.

FIGS. 3-5 show an especially preferred embodiment of the present invention in which three columns or ribs 13 help stabilize battery block 10 when a PCB 30 is inserted into PCB opening 19 in battery block 11. Each column 13 provides structural support to prevent top surface 17 from bowing away from bottom surface 18, thus helping to maintain electrical contacts with PCB 30, and PCB 30 has channels (see FIG. 4) that are designed to receive columns 13 to provide a mating fit. In an especially preferred embodiment, each frictionally formed electrical lead (e.g., 15.1 and 16.1) is supported by its own unique channel of resilient housing formed by at least one column 13 and each unique channel is independently resilient.

After battery 10 is inserted into battery block 11, switch assembly 20 can be assembled to battery block 11. Switch assembly 20 can be designed so that it fits into an opening in battery block 11 and can be held in place by an interference fit. Switch assembly 20 has first and second switch assembly leads 20.1 and 20.2 that extend into PCB opening 19 in battery block 11. Switch assembly 20 can be constructed so that it extends above battery block 11, as shown in FIG. 1, although it is preferable that the top of switch assembly 20 is flush with battery block 11 so as to make a more compact assembled module. Also, although FIG. 1 shows the opening in which switch assembly block 20 is inserted has three sides, it need not be so, and could instead be a four-sided opening formed near the end of battery block 11 where PCB 30 is inserted. The details of switch assembly 20 are not critical to the present invention, and any number of different switch assemblies can be used, an example of which is U.S. Pat. No. 7,347,577, the details of which are specifically incorporated herein by reference.

After switch assembly 20 has been assembled to battery block 11 (see FIG. 1), PCB 30 is inserted into PCB opening 19. PCB 30 can carry a variety of electronics, shown generally as 33, to control electrical function of electrical assembly 1. (Electronics 33 can include, but do not necessarily need to include, a microprocessor.) Electronics 33 can be pre-mounted on PCB 30 before PCB is assembled to battery block 11. PCB 30 has multiple conductive traces 32 aligned so that when PCB 30 is inserted into PCB opening 19 they will make electrical contact with second lead 15.2 of conductor 15, second lead 16.2 of conductor 16, and first and second switch assembly leads 20.1 and 20.2, and it is especially preferred that insertion of PCB 30 causes leads 15.2 and 16.2 to bend over so as to secure electrical contact and also assist with creating an interference fit. PCB 30, in an especially preferred embodiment, has a radius 31 (FIG. 4) that increases the surface area for contact and PCB 30 is held within battery block 11 by an interference fit. Because battery block 11 is made of a resilient material, once PCB 30 has been inserted into PCB opening 19 and the four leads are electrically connected, the housing will bias the leads, each in its own unique channel, against their respective conductive members of PCB 30. PCB 30 can also have either male or female mating members (not shown) designed to mate in a snap fit fashion with corresponding female or male mating members in either or both of battery block 11 and ribbon block 41. Alternatively, and in an especially preferred embodiment, PCB 30 does not have any male or female mating members and, instead, battery block 11 and ribbon block 41 snap fit together, holding PCB 30 inside, so as to create a small, self-contained module that can be used, for example, in footwear, clothing and other uses. Such a module can have transparent or translucent walls and also contain one or more LEDs positioned within such walls that can be seen through the walls when the module is appropriately positioned in footwear, clothing or the like.

After PCB 30 is inserted into PCB opening 19 of battery block 11 it is then inserted into PCB opening 42 of ribbon block 41, although the order of such assembly steps can be reversed.

Ribbon block assembly 40 is an assembly of ribbon block 41 and ribbon wire assembly 50. Ribbon wire assembly 50 has at least one conductive wire 51, and usually groups of multiple conductive wires 51, each of which has an insulative covering 52 surrounding it, with a portion of insulative covering 52 being stripped away (shown as 53 in FIG. 7) so as to allow electrical contact to be made with the conductive wire. It is especially preferred that insulative covering 52 is only stripped away where electrical contact is to be made with the conductive wire and the back half of insulative covering 52 remains in place, as such back covering will assist in making a more secure electrical contact upon assembly when it is compressed by a forced connection between the exposed area of the conductive wire and the electrical conductor member to which it is being electrically connected.

Figure 6A:
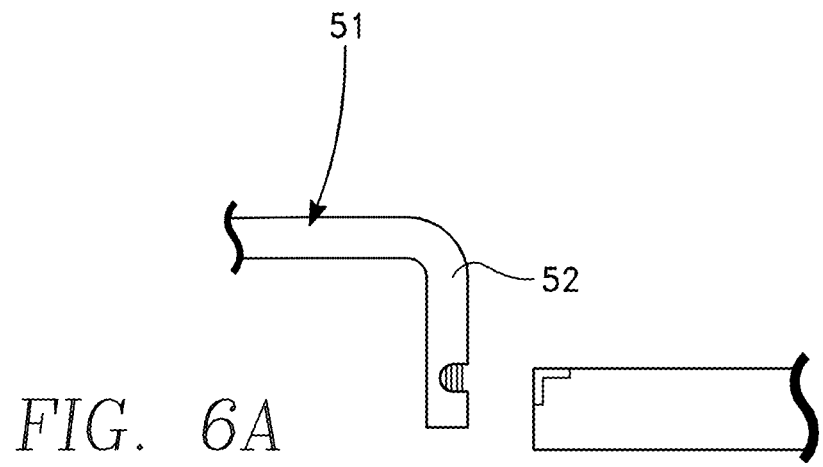
FIGS. 6A-6C illustrate contact being made between a PCB trace and a wire with a slit in its insulative covering.
Figure 6B:
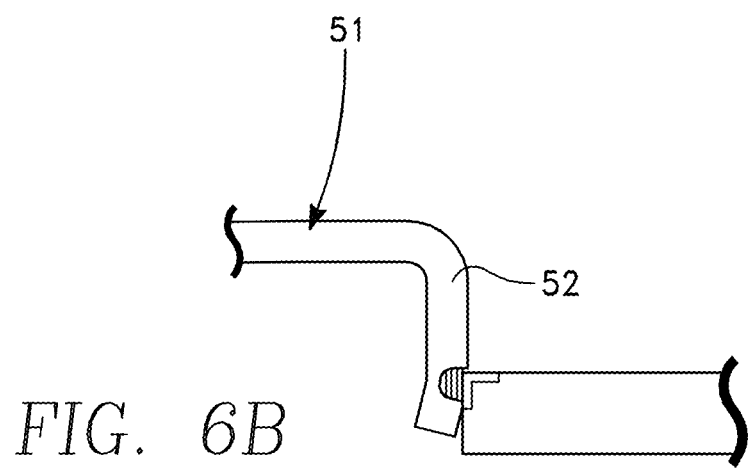
Figure 6C:
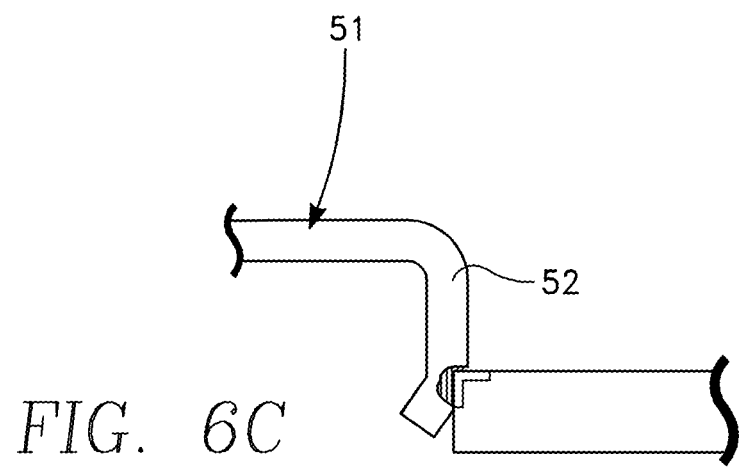

Ribbon block assembly 40 is inserted into ribbon opening 43 of ribbon block 41 where it is held in place by an interference fit. Once PCB 30 is fully inserted into PCB opening 42, conductive traces 32 will make electrical contact with conductive wires 51 at exposed portions 53 of insulative covering 52 (see FIG. 6). It has been found that such electrical contact can be made without the need to use through hole PCB connections, which reduces the cost of the PCB 30 needed in accordance with the present invention, by causing the exposed conductive wire to be bent over a top of PCB 30. (While it has been found that through hole PCB connections are not required for use with ribbon wire LEDs, to be described later, there may be other uses of electrical assemblies in which through hole PCB connections might be desirous, and such a possibility would still be within the scope of the present invention). It also bears note that the electrical connections formed between PCB 30 and both battery 10 and switch assembly 20 also do not require the use of through hole PCB connections. Finally, in an especially preferred embodiment, instead of stripping insulative covering 52 away, a slit is made in insulative covering 52 and then electrical contact is made between a conductive wire and a conductive trace 32 of a top surface of PCB 30, as is illustrated in FIGS. 6A-6C.

Electrical assembly 1 of the present invention has many distinct advantages.

One major advantage of electrical assembly 1 is that it can be assembled without the use of any solder. This represents a significant advantage, especially as there is more and more concern about environmental effects of solder.

Another major advantage of electrical assembly 1 is ease of manufacturing and assembly, which greatly reduces cost. Because solder is not required, no soldering iron steps are required, thus reducing cost. Also, electrical assembly 1 can be manufactured from subcomponents with just six assembly steps without using separate connecting parts, which greatly reduces its cost of manufacture. In a similar fashion, multiple PCBs can be electrically connected together in a single electrical assembly in which multiple PCBS are interconnected by use of one or more ribbon block assemblies.

Electrical assembly 1 is particularly well suited for use in applications where it can be used to power LEDs, some examples of which include footwear, clothing and strings of LEDs. In such a use one or more LEDs 60 can be assembled to electrical assembly 1, without the use of solder, by using a wire block assembly for each LED, which will now be described.

Each LED 60 can be assembled to its own pair of conductive wires 51 or multiple LEDs can be assembled on a single pair of conductive wires 51 (see FIG. 8). In an especially preferred embodiment of the present invention, LED leads end with a sharp pin point 62 (see FIG. 13) which is useful in piercing an insulative covering 52 of conductive wires 51.

Figure 9:
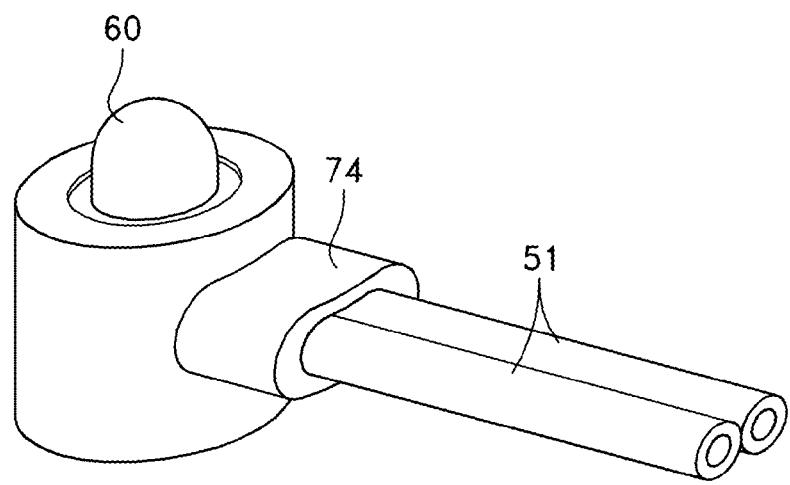
Figure 10:
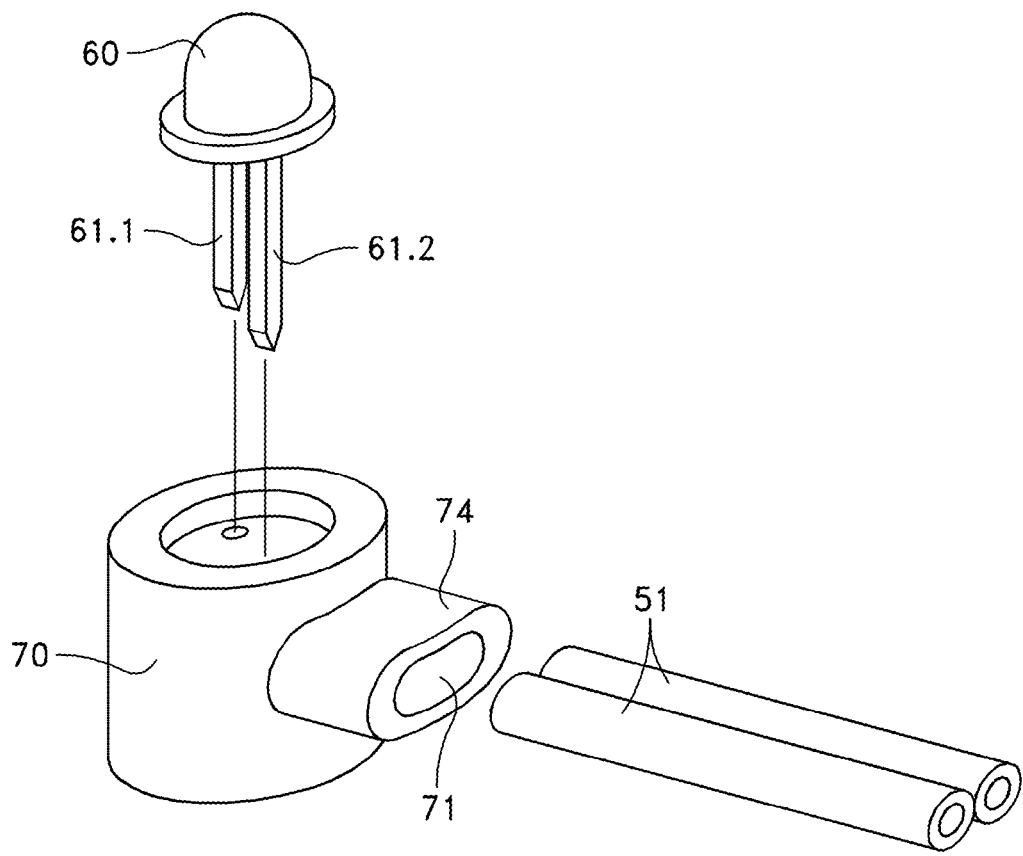
FIG. 10 is an exploded view of FIG. 9.

In accordance with an especially preferred embodiment of the present invention, an LED block 70 (see FIG. 10) has a wire hole 71 into which a pair of conductive wires 51 for a single LED 60 is inserted. In an especially preferred embodiment, illustrated in FIGS. 9 and 10, LED block 70 has a stress reliever 74 that extends outwardly around wire hole 71 to lessen stress that might otherwise be exerted upon a pair of conductive wires 51 inserted into LED block 70. When multiple LED blocks 70 are to be used on a pair of conductive wires 51, the blocks can be aligned along the pair of conductive wires 51 before LEDs 70 are inserted into each LED block 70. Because multiple LED blocks 70 can be used on a single pair of conductive wires 51, a large number of LEDs 70 can be supported by a single electrical assembly. For example, electrical assembly 1 can be used to support a ribbon block assembly 40 that has four pairs of conductive wires 51, each of which has up to nine (or more) LED blocks 70, which means the total assembly can support 36 or more LEDs, in a very inexpensive, yet reliable, assembly.

Figures 14, 15, 16:
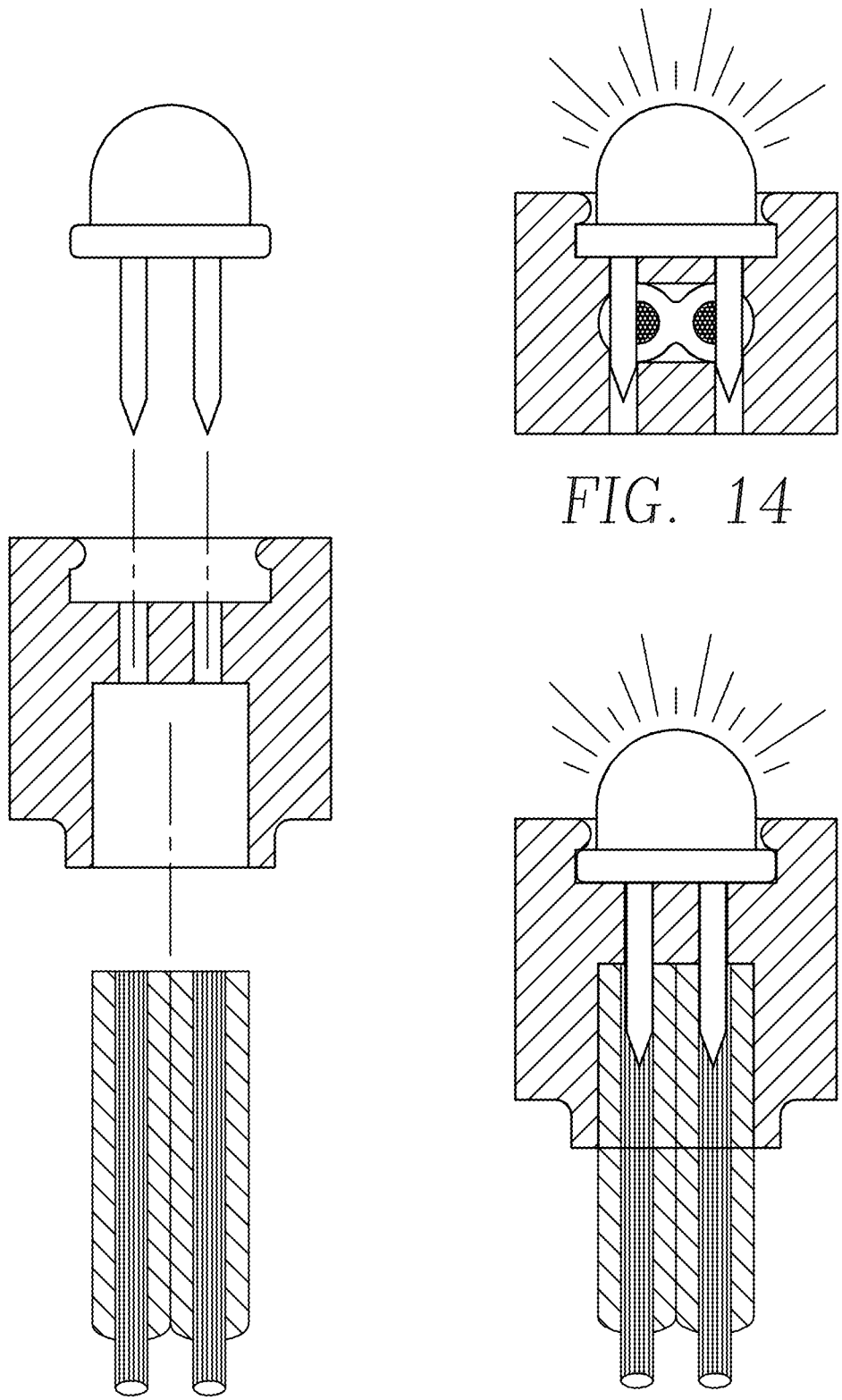
Figure 17:
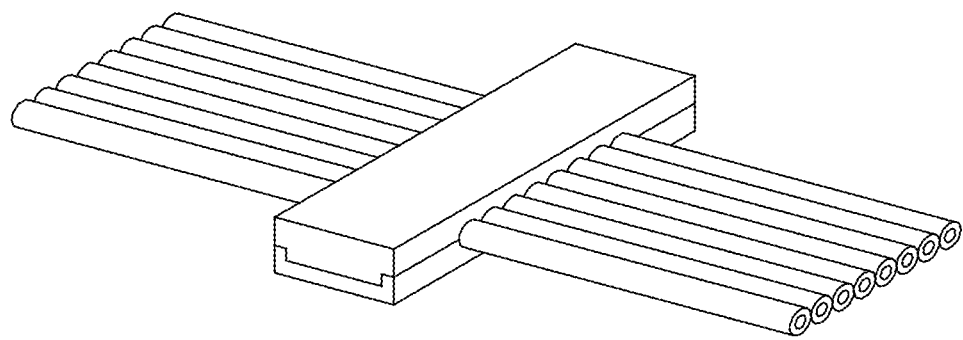
FIG. 17 illustrates an interconnector of two ribbon wires.
Figure 18:
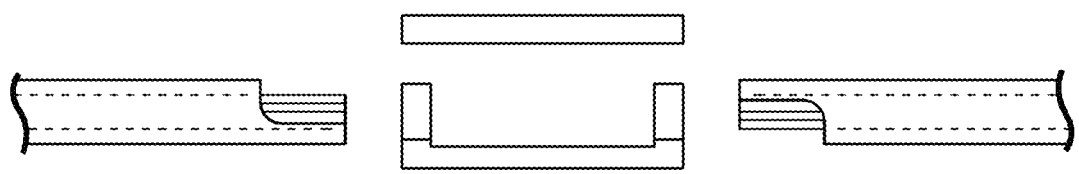
Figure 19:
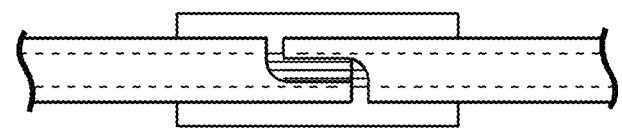
FIG. 19 is a phantom side view of FIG. 17, assembled and connected.

After a pair of conductive wires 51 is firmly in place in an LED block 70, first and second LED leads 61.1 and 61.2 of an LED 60 are each brought down and inserted into LED lead cavities 72 of LED block 70. LED lead cavities 72 can be designed to adjust the spacing of LED leads 61.1 and 61.2 and self-align them for insertion into a pair of conductive wires 51. Such self-alignment can be accomplished, for example, by forcing LED leads 61.1 and 61.2 together by narrowing the width of LED lead cavities 72 when the width between LED leads 61.1 and 61.2 is greater than the width of the pair of conductive wires 51 where they will make contact (see FIG. 13*a*). Also, if the width of the LED leads 61.1 and 61.2 is narrower than the width of the pair of conductive wires 51, then LED lead cavities 72 could be used to force LED leads 61.1 and 61.2 further apart and into alignment. As noted earlier, each lead 61.1 and 61.2 has a sharp pin point 62 that facilitates insertion of the leads through insulative covering 52 of conductive wires 51. Wire hole 71 and LED lead cavities 72, in an especially preferred embodiment (see FIG. 13), intersect at a right angle. Alternatively, the angle can vary (see FIGS. 11 and 12), or wire hole 71 and LED lead cavities 72 can even meet straight on (see FIG. 16), although such configurations are not preferred.

Accordingly, the present invention allows many LEDs to be used in a variety of applications without the need for any solder whatsoever and such construction can be achieved by a simple assembly process that greatly reduces manufacturing cost. This represents a significant advantage over prior art techniques, especially when many LEDs are being combined and electrically connected in parallel on a single pair of conductive wires 51.

Figure 2:
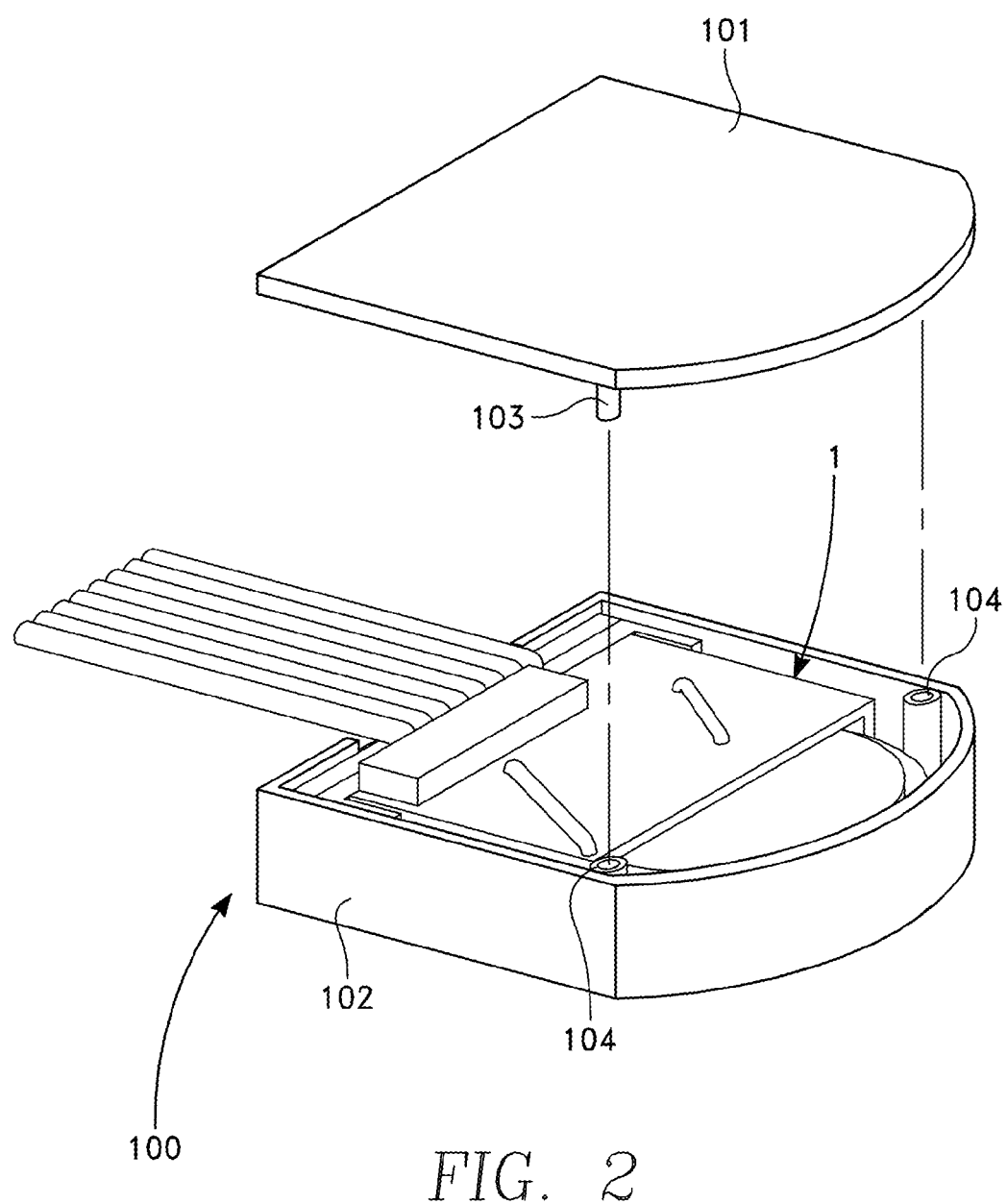
FIG. 2 is a cross sectional view of the assembly of FIG. 1 in an unexploded state.

So far the present disclosure has disclosed how a number of sub-assemblies can be assembled quickly, simply, and economically without the use of solder. A further embodiment will now be disclosed in which electrical assembly 1 is placed inside of an outer case 100 which can conveniently be constructed of plastic. As illustrated in FIG. 2, outer case 100 has case bottom 102 in which electrical assembly 1 is placed and case cover 101 which is then closed complete a sealed case. In an especially preferred embodiment, either case cover 101 or case bottom 102 has one or more male members 103 designed to mate with counterpart one or more female members 104 found in its opposite member. The mating of one or more male and female members serves as an alignment guide as well as increasing structural integrity of a sealed case. After electrical assembly 1 is inserted into case bottom 102 and case cover 101 is closed, the case can be sonic welded. Wires 50 extend out of the sealed case, with the case acting both to insulate electrical assembly 1 and also to help insure the structural integrity of ribbon block assembly 40 which is now bent over ninety degrees by closing of case cover 101 and held in place by the sonic welding (see FIG. 2). (It is also further possible that sonic welding can cause insulative covering 52 of conductive wires 51 to weld to the parts of case 100, thus creating an even stronger bond, and making it less likely for ribbon wire assembly 50 to move in future use.)

While the foregoing disclosure has used the example of an LED as an example of an electrical component held in a housing attached to a pair of conductive wires, the present invention is not limited to only using LEDs, and is meant to cover any electrical component with two conductive leads. Thus, for example, a speaker or audio producing device or some other electrical component such as a sensor, a transducer, a potentiometer, a switch, a motor, a thermocouple or a variable capacitor could be used instead of an LED, and the leads of such components can be constructed and inserted into a suitable housing in the same fashion as the LED leads described in the above disclosure. Accordingly, the disclosure of the present invention can be used to create a variety of assemblies in which multiple electrical components are connected to pairs of conductive wires that are gathered in a ribbon block that is then connected to an assembly which includes a PCB. The assembly which includes the PCB can be constructed to include a battery, in which case it can function as the battery block described above, or it can be constructed so as to not include a battery if the application for the assembly does not require a battery for its source of power. If a battery is included, assemblies can be created in which multiple electrical components, and multiple strings of LEDs that can be energized to emit light in parallel, can all be powered from a single battery source, all of which can be assembled without the use of any solder.

It should also be noted that the teachings of the present invention can also be applied to any electrical component that has three or more conductive leads that are to be connected to three or more conductive wires. In such an embodiment, the housing will have additional lead holes to accommodate the additional leads which will then be guided toward their additional conductive wires in the same fashion that the present disclosures sets forth for two conductive leads and two conductive wires.

Accordingly, the present invention discloses a simple, cost-effective electrical assembly and process of manufacture that is environmentally friendly and, in an especially preferred embodiment, well suited for use with LEDs. Moreover, the electrical assembly is compact and sturdy and well suited for use in a variety of applications, including for use in footwear and clothing.

Although the foregoing detailed description is illustrative of preferred embodiments of the present invention, it is to be understood that additional embodiments thereof will be obvious to those skilled in the art. For example, it is possible to connect multiple electrical assemblies 1 together so that a single switch assembly 20 triggers multiple chains of LEDs to activate at the same time. Such an assembly will be particularly useful for footwear and other applications where size and cost is important, but it is desired that a large number of LEDs (e.g., twelve), light at the same time. In addition, it is possible that multiple batteries can be aligned next to each other, instead of on top of each other, where there is more concern about vertical height of an assembled unit than horizontal length of the unit. Also, electrical components with multiple leads, instead of LEDs, can be connected to a pair of conductive wires using an electrical component block that applies the principals stated herein to such components. Further modifications are also possible in alternative embodiments without departing from the inventive concept.

Accordingly, it will be readily apparent to those skilled in the art that still further changes and modifications in the actual concepts described herein can readily be made without departing from the spirit and scope of the disclosed inventions as defined by the following claims.

What is claimed is:

1. An electrical assembly, comprising:
   a first block housing;
   a ribbon block;
   a printed circuit board ("PCB") having a surface with a plurality of electrically conductive elements located between a first end of the PCB and a second end of the PCB; and
   a ribbon wire assembly held within the ribbon block by an interference fit;
   wherein the ribbon wire assembly is comprised of one or more wires having an insulated covering with a stripped portion at an end thereof;
   wherein the first block housing and the ribbon block are connected by a snap fit to form a completed assembly which holds first and the second ends of the PCB;
   wherein the first end of the PCB is held within a PCB opening in the first block housing and the second end of the PCB is held within the ribbon block; and
   wherein each stripped portion of the one or more wires of the ribbon wire assembly is held in electrical contact with one of the electrically conductive elements of the surface of the PCB without the use of any solder by the ribbon block when the second end of the PCB is held within the ribbon block.

2. The electrical assembly of claim 1, further comprising:
   a battery held within a battery block opening in the first block housing;
   a first conductor and a second conductor held within the first block housing, each of the first and second conductors having a first lead in mechanical and electrical conduct with the battery without the use of any solder and a second lead in mechanical and electrical conduct with the PCB without the use of any solder, the first lead of the first conductor being electrically connected to a positive terminal of the battery and the first lead of the second conductor being electrically connected to a negative terminal of the battery.

3. The electrical assembly of claim 1, wherein the first end of the PCB is held within the PCB opening in the first block housing by a first interference fit and the second end of the PCB is held within the ribbon block by a second interference fit.

4. The electrical assembly of claim 1, wherein no solder is used in the assembly.

5. The electrical assembly of claim 2, wherein no solder is used in the assembly.

6. An assembly, comprising:
   a first block housing;
   a printed circuit board ("PCB") having a first end held in a PCB cavity of the first block housing by a PCB interference fit without the use of any solder;
   a ribbon block attached to the PCB, said ribbon block holding a second end of the PCB;
   a first and a second wire, each of which is comprised of a conductor which is insulated by an insulator, said first and second conductive wires being held by the ribbon block; and
   an electrical component having two conductive leads, each of which is electrically connected to the conductor of one of the first and the second wires, said electrical component being attached to the first and the second wires;
   wherein each of the first and the second wires has a stripped portion at an end thereof electrically connected to an electrically conductive element of the PCB and one of the first and the second wires without the use of any solder when the ribbon block is attached to the PCB.

7. The assembly of claim 6, wherein the insulator of each of the first and the second wires is resilient and wherein the PCB has a top surface having a first and a second electrical trace.

8. The assembly of claim 7, wherein the insulator of the first conductive wire biases the exposed portion of the conductor of the first conductive wire into electrical contact with the first electrical trace and the insulator of the second conductive wire biases the exposed portion of the conductor of the second conductive wire into electrical contact with the second electrical trace when the ribbon block is attached to the PCB.

9. The assembly of claim 7, further comprising a first conductor held by the first block housing wherein insertion of the PCB into the PCB cavity to form the PCB interference fit forces the first conductor into a first electrical contact with a first conductive member of the PCB and causes the first block housing to bias the first conductor against the first conductive member of the PCB.

10. The assembly of claim 9, further comprising a second conductor held by the first block housing wherein insertion of the PCB into the PCB cavity to form the PCB interference fit forces the second conductor into a second electrical contact with a second conductive member of the PCB and causes the first block housing to bias the second conductor against the second conductive member of the PCB.

11. An assembly, comprising:
    a first block housing;
    a first and a second conductor held by the first block housing;
    a printed circuit board ("PCB") which has a top surface having a first and a second electrical trace, wherein said PCB is held in a PCB cavity of the first block housing by an interference fit without the use of any solder;
    a ribbon block attached to the PCB;
    a first and a second wire, each of which is comprised of a conductor which is insulated by an insulator which is resilient and has a stripped portion at an end thereof, said first and second conductive wires being held by the ribbon block;
    an electrical component having a first conductive lead and a second conductive lead, the first conductive lead being electrically connected to the conductor of the first wire distant from the exposed portion of the conductor of the first wire, the second conductive lead being electrically connected to the conductor of the second wire distant from the exposed portion of the conductor of the second wire, said electrical component being attached to the first and the second wires;
    wherein the first wire is electrically connected to the first electrical trace and the first conductive lead without the use of any solder and the second wire is electrically connected to the second electrical trace and the second conductive lead without the use of any solder; and wherein insertion of the PCB into the PCB cavity to form the PCB interference fit forces the first conductor into electrical contact with a first conductive member of the PCB and causes the first block housing to bias the first conductor against the first conductive member of the PCB; and wherein insertion of the PCB into the PCB cavity to form the PCB interference fit forces the second conductor into a second electrical contact with a second conductive member of the PCB and causes the first block housing to bias the second conductor against the second conductive member of the PCB.

12. The assembly of claim 11, wherein each of the first and the second conductors is held within a unique channel of the resilient housing which is independently resilient.

13. The assembly of claim 11, further comprising: a battery held in a battery opening of the first block housing by a battery interference fit without the use of any solder; wherein each of the first and the second conductors have a first lead in mechanical and electrical contact with the battery without the use of any solder and a second lead in mechanical and electrical contact with the PCB without the use of any solder, the first lead of the first conductor being electrically connected to a positive terminal of the battery and the first lead of the second conductor being electrically connected to a negative terminal of the battery.

14. The assembly of claim 13, wherein the first and the second conductors have a u shape before said first and second conductors are assembled to the first block housing and at least one of the first leads of the first and the second conductors is bent over during assembly.

15. The assembly of claim 13, further comprising a switch held by a switch interference fit with the first block housing, said switch having a first switch lead in electrical contact with a third conductive member of the PCB, the first switch lead being biased against the PCB by the first block housing.

16. The assembly of claim 13, further comprising six or more LEDs that are electrically connected to the first and the second conductive wires and are energized by the battery to emit light.

17. The assembly of claim 13, further comprising four or more groups of LEDs that are energized by the battery to emit light, and each of said four or more groups of LEDs are operable to be lit in parallel.

18. The assembly of claim 13, wherein no solder is used in the assembly.

19. The assembly of claim 11, wherein the electrical component is not comprised of a light emitting diode.

* * * * *